United States Patent
Jeong et al.

(10) Patent No.: US 6,815,300 B2
(45) Date of Patent: Nov. 9, 2004

(54) METHOD FOR MANUFACTURING SEMICONDUCTOR DEVICE HAVING INCREASED EFFECTIVE CHANNEL LENGTH

(75) Inventors: Hong-Sik Jeong, Kyungki-do (KR); Ki-Nam Kim, Kyungki-do (KR); Yoo-Sang Hwang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/427,172

(22) Filed: Apr. 30, 2003

(65) Prior Publication Data

US 2003/0216004 A1 Nov. 20, 2003

(30) Foreign Application Priority Data

May 14, 2002 (KR) ............................ 10-2002-0026438

(51) Int. Cl.⁷ ................. H01L 21/336; H01L 21/425; H01L 21/4763
(52) U.S. Cl. .................. 438/305; 438/303; 438/529; 438/279; 438/533; 438/639; 438/527
(58) Field of Search ................. 438/303, 527, 438/529, 533, 301, 305, 639, 279

(56) References Cited

U.S. PATENT DOCUMENTS

| | | | |
|---|---|---|---|
| 5,373,178 A | * 12/1994 | Motoyoshi et al. | 257/344 |
| 5,656,520 A | * 8/1997 | Watanabe | 438/305 |
| 5,763,312 A | 6/1998 | Jeng et al. | |
| 5,940,710 A | * 8/1999 | Chung et al. | 438/305 |
| 6,004,842 A | * 12/1999 | Ikemasu et al. | 438/241 |
| 6,078,073 A | * 6/2000 | Habu et al. | 257/296 |
| 6,531,747 B1 | * 3/2003 | Ashida et al. | 257/368 |

* cited by examiner

*Primary Examiner*—John F. Niebling
*Assistant Examiner*—Ron Pompey
(74) *Attorney, Agent, or Firm*—Marger Johnson & McCollom, P.C.

(57) ABSTRACT

In one embodiment, a plurality of gate structures including gate electrodes and insulating layers covering the gate electrodes are formed on a semiconductor substrate. Impurity ions at a low dose for forming a source/drain region are implanted into the semiconductor substrate, using the gate structures as a mask. First insulating spacers are formed on the sidewalls of the gate structures and second insulating spacers are formed on the first insulating spacers. Thereafter, impurity ions at a high dose are implanted into the semiconductor substrate, using the first and second insulating spacers as a mask. Then, the second insulating spacers are removed. Therefore, contact resistance and characteristics of the transistors can be improved by adjusting an effective channel length and contact areas.

35 Claims, 14 Drawing Sheets

METHOD FOR MANUFACTURING SEMICONDUCTOR DEVICE HAVING INCREASED EFFECTIVE CHANNEL LENGTH

BACKGROUND OF THE INVENTION

This application claims priority from Korean Patent Application No. 2002-26438, filed May 14, 2002, which is incorporated herein by reference in its entirety.

1. Field of the Invention

The present invention relates to a method for manufacturing a semiconductor device, and more particularly, to a method for manufacturing a semiconductor device for improving operational characteristics of dynamic random access memory (DRAM) cells by improving contact resistance and characteristics of transistors in manufacturing a semiconductor device having contact plugs that are self-aligned with gate electrodes.

2. Description of the Related Art

When manufacturing a highly integrated semiconductor device, such as DRAM, call areas decrease as a design rule decreases. Accordingly, because contact resistance and a short channel effect increase, the breakdown voltage of cell transistors decreases so that there is a limit in forming reliable cell transistors.

Meanwhile, in order to highly integrate a semiconductor device, such as DRAM, technology for forming contact plugs between gate electrodes by a self-aligned method has been developed to form a fine device, which is required in a highly integrated semiconductor device, regardless of precision in alignment between patterns. In a method for manufacturing a semiconductor device in a self-aligned manner, gate electrodes are patterned, impurity ions at a low dose are implanted, and spacers are formed on the sidewalls of the gate electrodes, so that impurity ions at a high dose are implanted so as to form source/drain regions of a lightly doped drain (LDD) structure. In addition, when manufacturing a device having a design rule of less than 0.2 $\mu$m, a high doping implantation process for forming source/drain regions is generally performed after patterning an interlayer insulating layer for forming self-aligned contact holes. Here, in order to secure a sufficient breakdown voltage for obtaining desired operational characteristics of cell transistors in a highly integrated semiconductor device, a doping dose in a substrate has to be increased, or a sufficient effective channel length has to be secured to prevent a punch-through effect. However, a method of increasing a doping dose has a side effect of increasing a junction leakage current so that retention time suddenly falls. Consequently, in order to prevent the above problem, an effective channel length has to be increased by increasing the width of the gate electrodes or the width of the spacers formed on the sidewalls of the gate electrodes, while refraining from increasing the doping dose. However, this method is difficult to be applied when manufacturing a highly integrated semiconductor device. Furthermore, this method reduces contact areas between contact plugs and source/drain regions thereby increasing contact resistance so that cell failure occurs.

SUMMARY OF THE INVENTION

The present invention contemplates a method for manufacturing a highly integrated semiconductor device to improve the reliability of cell transistors by increasing an effective channel length while preventing contact areas between the source/drain and contact plugs from decreasing.

According to a first embodiment of the present invention, a plurality of gate structures including gate electrodes and insulating layers covering the gate electrodes are formed on a semiconductor substrate. Impurity ions at a low dose for forming a source/drain region are implanted into the semiconductor substrate using the gate structures as a mask. First insulating spacers are formed on the sidewalls of the gate structures. A liner is formed on the gate structures and on the first insulating spacers to form second insulating spacers. A planarized interlayer insulating layer pattern for defining holes between adjacent second insulating spacers, through which the semiconductor substrate is exposed, is formed on the gate structures. Impurity ions at a high dose for forming the source/drain are implanted into the semiconductor substrate, using the interlayer insulating layer pattern and the second insulating spacers as a mask. The second insulating spacers are removed.

It is preferable that the removal of the second insulating spacers is performed by a wet etching method using ozone water. To this end, a first wet etching process is performed using an etchant having the ozone water and a hydrogen fluoride (HF) solution. Thereafter, a second wet etching process is performed using the ozone water. It is preferable that the mixed solution of the ozone water and the HF solution be mixed at a volume ratio of about 1000:1 to about 1500:1.

The removal of the second insulating spacers may be performed by a down-stream plasma etching process using a gas mixture having oxygen ($O_2$) and carbon fluoride ($CF_4$). Here, $O_2$ and $CF_4$ is mixed at a flow ratio of about 10:1 to about 100:1 to form the gas mixture.

The method of manufacturing a semiconductor device according to the first embodiment of the present invention may further include forming a planarized interlayer insulating layer pattern for defining holes between the adjacent second insulating spacers, through which the semiconductor substrate is exposed, on the gate structures, and forming third insulating spacers on the sidewalls of the interlayer insulating layer pattern and the second insulating spacers. Here, the implantation of the impurity ions at a high dose is performed, using the interlayer insulating layer pattern and the third insulating spacers as a mask. The second insulating spacers and the third insulating spacers may be concurrently removed.

According to a second embodiment of the present invention, a plurality of gate structures including gate electrodes and insulating layers covering the gate electrodes are formed on a semiconductor substrate. Impurity ions at a low dose for forming source/drain are implanted into the semiconductor substrate using the gate structures as a mask. First insulating spacers are formed on the sidewalls of the gate structures. A planarized interlayer insulating layer pattern for defining holes, through which the low dose impurity ion implanted semiconductor device is exposed, is formed on the gate structures. Second insulating spacers are formed on the sidewalls of the interlayer insulating layer pattern and on the first insulating spacers. Impurity ions at a high dose for forming the source/drain are implanted into the semiconductor substrate, using the interlayer insulating layer pattern and the second insulating spacers as a mask. The second insulating spacers are removed.

Preferably, the first insulating spacers may be formed of silicon nitride layers. Alternately, the first insulating spacers comprise silicon nitride layers contacting the gate structures and silicon oxide layers formed on the silicon nitride layers.

The method for manufacturing a semiconductor device according to the second embodiment of the present invention may further include forming an oxide liner on the gate structures and on the first insulating spacers, after the first insulating spacers are formed, and additionally implanting impurity ions at a low dose into the semiconductor substrate, using the oxide liner as a mask.

In order to form the interlayer insulating layer pattern, a planarized interlayer insulating layer is formed on the semiconductor substrate, into which the impurity ions of low are additionally implanted, and on the oxide liner. The interlayer insulating layer is patterned to form the holes therein. The portions of the oxide liner are removed to expose the first insulating spacers while patterning the interlayer insulating layer.

According to a third embodiment of the present invention, gate electrodes are formed on a first region of a semiconductor substrate having the first region to form channels and a second region to form a source/drain region. Impurity ions at a low dose are implanted into the second region, using the gate electrodes as a mask. First insulating spacers are formed on the sidewalls of the gate electrodes to expose the second region to a first width in a first direction orthogonal to the lengthwise direction of the gate electrodes. A planarized interlayer insulating layer pattern for defining holes through which the first insulating spacers are exposed, is formed on the gate electrodes. Second insulating spacers are formed on the sidewalls of the interlayer insulating layer pattern and on the first insulating spacers to expose the second region to a second width, which is narrower than the first width. Impurity ions at a high dose are implanted into the second region, using the interlayer insulating layer pattern and the second insulating spacers as a mask. The second insulating spacers are removed to expose the second region to the first width.

The method for manufacturing a semiconductor device according to the third embodiment of the present invention may further include removing portions of the first insulating spacers to expose the second region to a third width, which is wider than the first width.

The method for manufacturing a semiconductor device according to the third embodiment of the present invention may further include forming a nitride liner on the first insulating spacers to expose the second region to a fourth width, which is narrower than the first width. Here, the second insulating spacers are formed on the nitride liner.

The method for manufacturing a semiconductor device according to the third embodiment of the present invention may further include forming an oxide liner on the first insulating spacers to expose the second region to a fourth width, which is narrower than the first width, and additionally implanting impurity ions at a low dose into the second region, using the oxide liner as a mask.

According to the present invention, channel length and contact areas are controlled using insulating spacers in manufacturing a highly integrated semiconductor device having contact plugs self-aligned with gate electrodes. Therefore, operational characteristics of DRAM cells can be improved by securing reliability of cell transistors, while preventing contact resistance of the semiconductor device from increasing.

BRIEF DESCRIPTION OF THE DRAWINGS

The above objectives and advantages of the present invention will become more apparent by describing in detail preferred embodiments thereof with reference to the attached drawings, in which.

DETAILED DESCRIPTION OF THE INVENTION

Figure 1A:
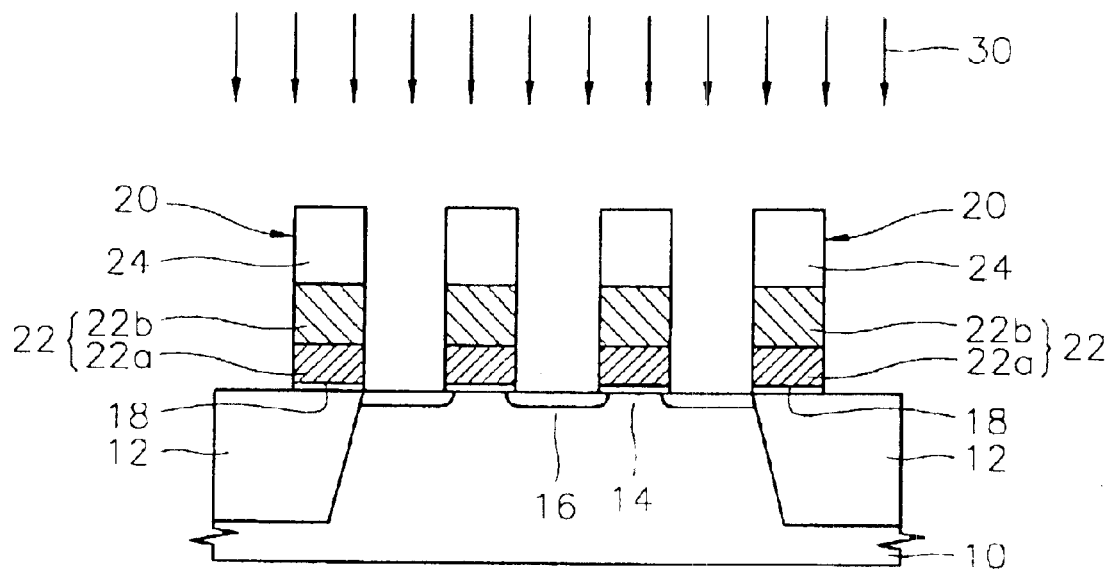
FIGS. 1A through 1H are sectional views illustrating a method for manufacturing a semiconductor device according to a first embodiment of the present invention.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the thickness of the layers and regions are exaggerated for clarity. It will also be understood that when a layer is referred to as being "on" another layer or substrate, it can be directly on the other layer or substrate, or there may exist intervening layers.

FIGS. 1A through 1H are sectional views of stages illustrating a method for manufacturing a semiconductor device according to a first embodiment of the present invention.

Referring to FIG. 1A, isolation regions 12 for defining an active region are formed in a semiconductor substrate 10, for example, a p-type semiconductor substrate. The isolation regions 12 can be formed by conventional techniques such as a shallow trench isolation (STI) process. The active region includes channel regions 14 and source/drain regions 16. Thereafter, a gate insulating layer 18 is formed by, for example, a thermal oxidation method. A polysilicon layer 22a and a metal silicide layer 22b, such as a tungsten silicide layer, are sequentially formed on the gate insulating layer 18, and an insulating layer 24 formed of, for example, a silicon nitride layer, is formed thereon. The layers 18, 22a, 22b, and 24 are patterned to form a plurality of gate structures 20 including gate electrodes 22 and insulating layers 24 covering the gate electrodes 22, using a lithography-and-etching process.

Thereafter, oxide layers (not shown) are formed on the sidewalls of the gate structures 20 by a thermal oxidation method to cure damage to the semiconductor substrate 10 caused by the etching process. Consequently, the source/drain regions 16 of the semiconductor substrate 10 are exposed between the gate structures 20.

Impurity ions 30 at a low dose are implanted into the substrate 10 using the gate structures 20 as a mask. To this end, for example, phosphorous ions are implanted into the substrate 10 to a dose of about $1.0\times10^{13}$ ions/cm$^2$ at an energy level of about 30 KeV.

Figure 1B:
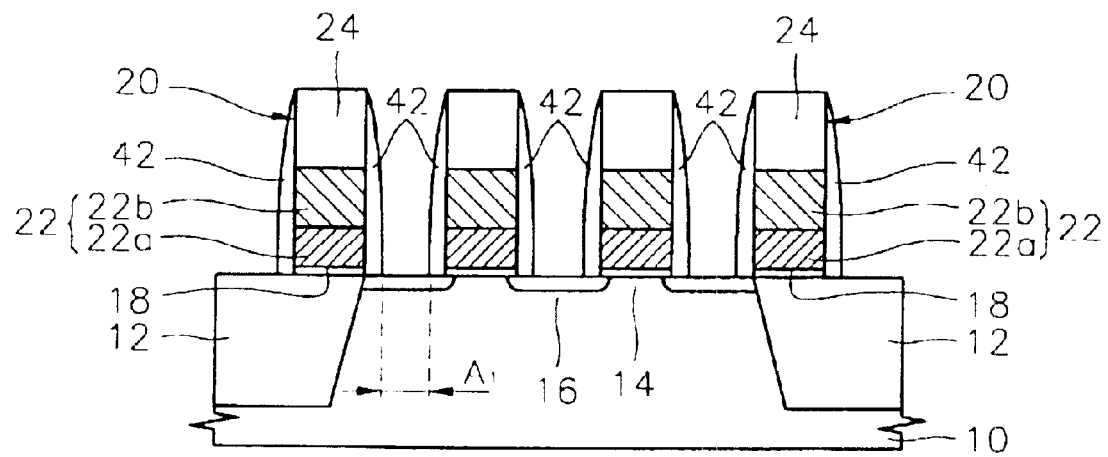

Referring to FIG. 1B, first insulating spacers 42 formed of an insulating material such as silicon nitride are formed on the sidewalls of the gate structures 20. The first insulating spacers 42 are formed by depositing the silicon nitride layer on the gate structures 20 and etching back the silicon nitride layer. By forming the first insulating spacers 42, the source/ drain regions 16 of the semiconductor substrate 10 are exposed to a first width A1 in a direction orthogonal to the lengthwise direction of the gate electrodes 22.

Figure 1C:
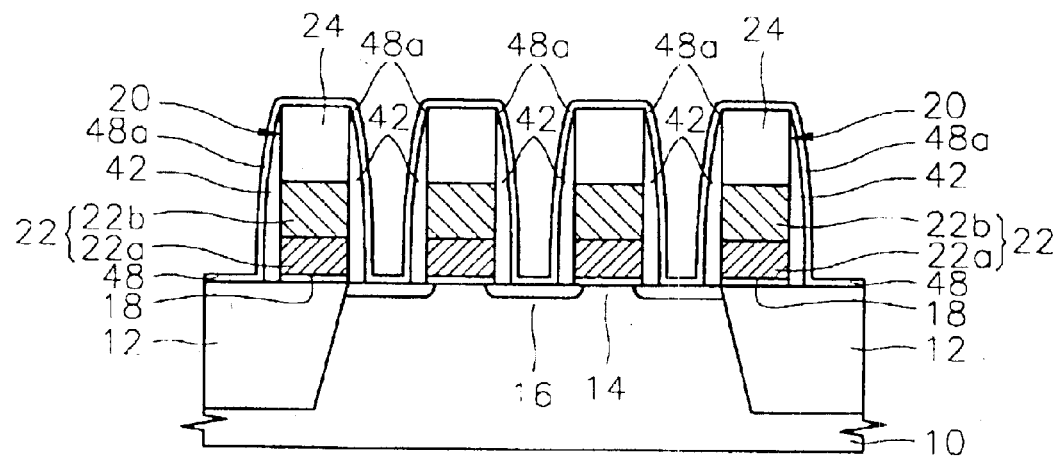

Referring to FIG. 1C, a liner 48 formed of an insulating material such as silicon nitride is formed on the gate structures 20 and the first insulating spacers 42 to a thickness of about 20 to 200 Å and preferably to a thickness of about 100 Å. By forming the liner 48, second insulating spacers 48a that cover the exposed surfaces of the first insulating spacers 42 are formed.

Figure 1D:
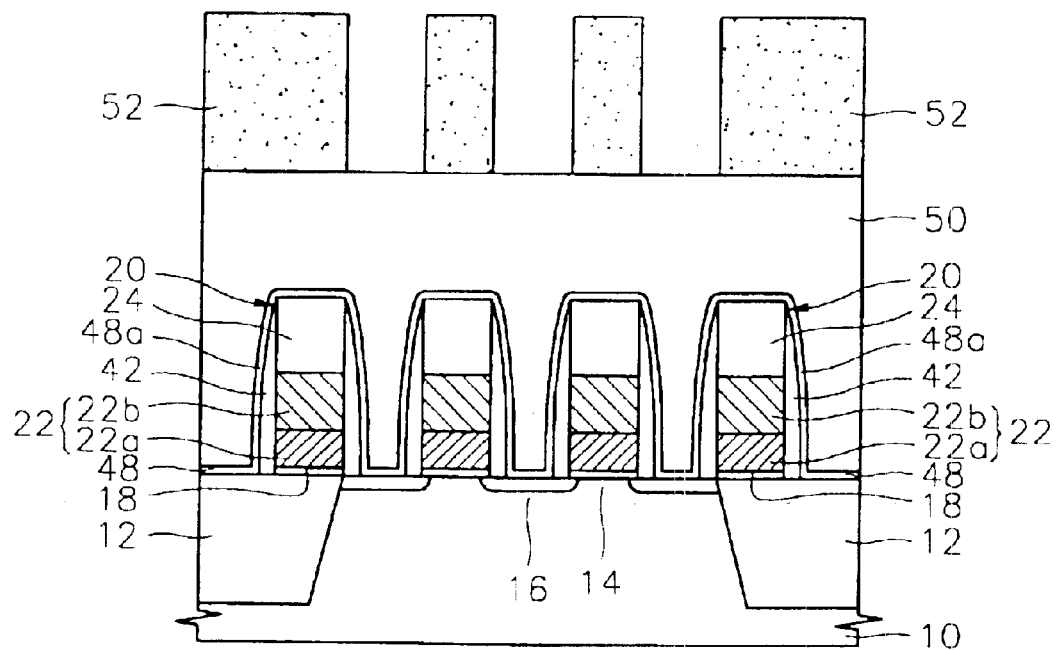

Referring to FIG. 1D, a planarized interlayer insulating layer 50 is formed on the resultant structure having the liner 48. The interlayer insulating layer 50 is formed of, for example, a borophosphosilicate glass (BPSG) or high density plasma (HDP) oxide layer. Thereafter, a photoresist layer pattern 52 is formed on the interlayer insulating layer 50 as an etch mask for patterning the interlayer insulating layer 50.

Figure 1E:
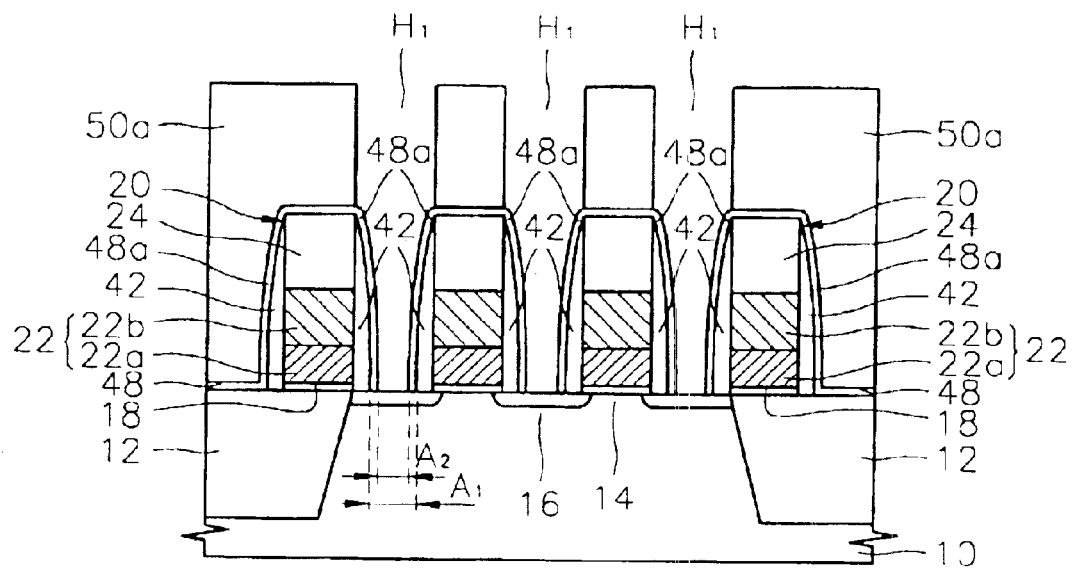

Referring to FIG. 1E, the interlayer insulating layer 50 is subjected to a self-aligned etching process to form an interlayer insulating layer pattern 50a for defining holes $H_1$ between the gate structures 20, using the difference between the etching selectivities of an oxide layer a nitride layer and using the photoresist layer pattern 52 as an etch mask. Here, the portions of the liner 48 which cover the semiconductor substrate 10 are removed by an over-etching so that the second insulating spacers 48a and the source/drain regions 16 of the semiconductor substrate 10 are exposed through the holes $H_1$. Here, the source/drain regions 16 of the semiconductor substrate 10 are exposed between adjacent second insulating spacers 48a, which are exposed through the holes $H_1$, to a second width $A_2$ narrower than the first width A1, in a direction orthogonal to the lengthwise direction of the gate electrodes 22.

Figure 1F:
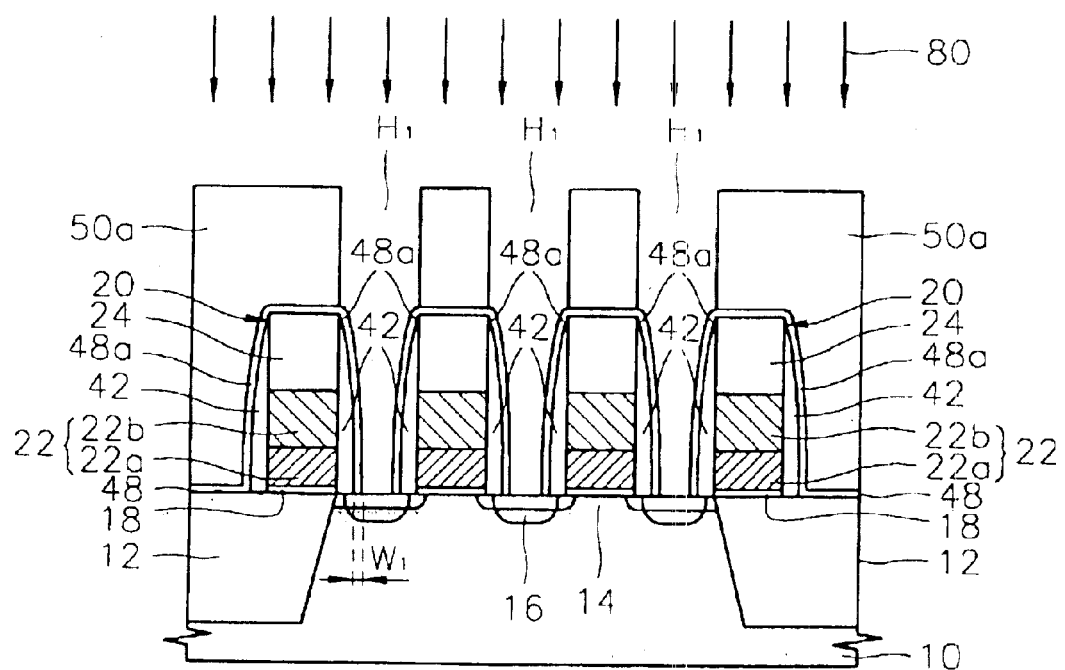

Referring to FIG. 1F, impurity ions 80 at a high dose are implanted into the resultant structure, using the interlayer insulating layer pattern 50a and the second insulating spacers 48a as a mask. Specifically, the ions, for example, phosphorous ions are implanted into the resultant structure at a dose of about $4.0 \times 10^{13}$ ions/cm$^2$ and at an energy level of about 30 KeV. As a result, since the width of the source/drain regions 16 of the semiconductor substrate 10, which are exposed to the ion implantation, is reduced to the second width $A_2$, an effective channel length to be formed in the channel regions 14 can be increased to twice the width $W_1$ of the second insulating spacer 48a.

Figure 1G:
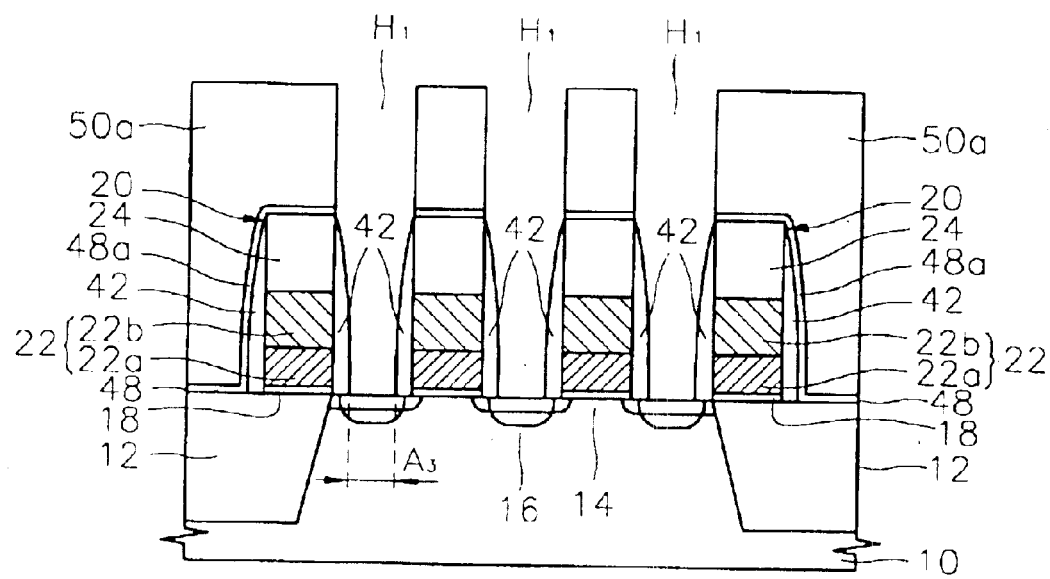

Referring to FIG. 1G, the second insulating spacers 48a exposed through the holes $H_1$ are removed, for example, by an isotropic etching process. The isotropic etching process may be a wet etching process using ozone water. In this case, a mixed solution is formed by mixing ozone water and a hydrogen fluoride (HF) solution to a volume ratio of about 1000:1 to about 1500:1. Thereafter, the second insulating spacers 48a are wet etched using the mixed solution as an etchant for about 25 seconds and wet etched using only the ozone water for about 20 seconds so that the second insulating spacers 48a are efficiently removed. It is preferable that the volume ratio of the ozone water and the HF solution be about 1380:1 in the mixed solution. After the second insulating spacers 48a are removed, a cleaning process is performed using HF to remove a native oxide layer.

Alternatively, the second insulating spacers 48a can be removed by an isotropic etching process including a down-stream plasma etching process using a gas mixture of oxygen ($O_2$) and carbon fluoride ($CF_4$). The down-stream plasma etching process can be performed using conventional ashing equipment. Here, it is preferable that the gas mixture be supplied by an $O_2:CF_4$ flow ratio of about 10:1 to 100:1. It is more preferable that the gas mixture of $O_2$ and $CF_4$ be supplied by an $O_2:CF_4$ flow ratio of about 40:1 in performing the down-stream plasma etching process while applying a power of about 700 W under a pressure of about 1 Torr and at a temperature of about 250° C.

By removing the second insulating spacers 48a, the source/drain regions 16 of the semiconductor substrate 10 are exposed through the holes H1 between adjacent first insulating spacers 42 to a third width $A_3$ wider than the second width $A_2$. Accordingly, because an increased area of the source/drain regions 16 of the semiconductor substrate 10 is exposed through the holes $H_1$, the contact areas between the contact plugs to be formed in the holes $H_1$ in subsequent processes and the semiconductor substrate 10 can be increased. Therefore, an increased effective channel length is secured while an increase in contact resistance is prevented.

When removing the second insulating spacers 48a, the third width $A_3$ of the source/drain regions 16 exposed through the holes $H_1$ can be approximately equal to the first width $A_1$ by removing only the second insulating spacers 48a. To improve the contact resistance characteristics, the portions of the first insulating spacers 42 can be removed along with the second insulating spacers 48a to increase the third width $A_3$ of the source/drain regions 16 larger than the first width $A_1$. The size of the third width $A_3$ can be changed depending on the process conditions.

Figure 1H:
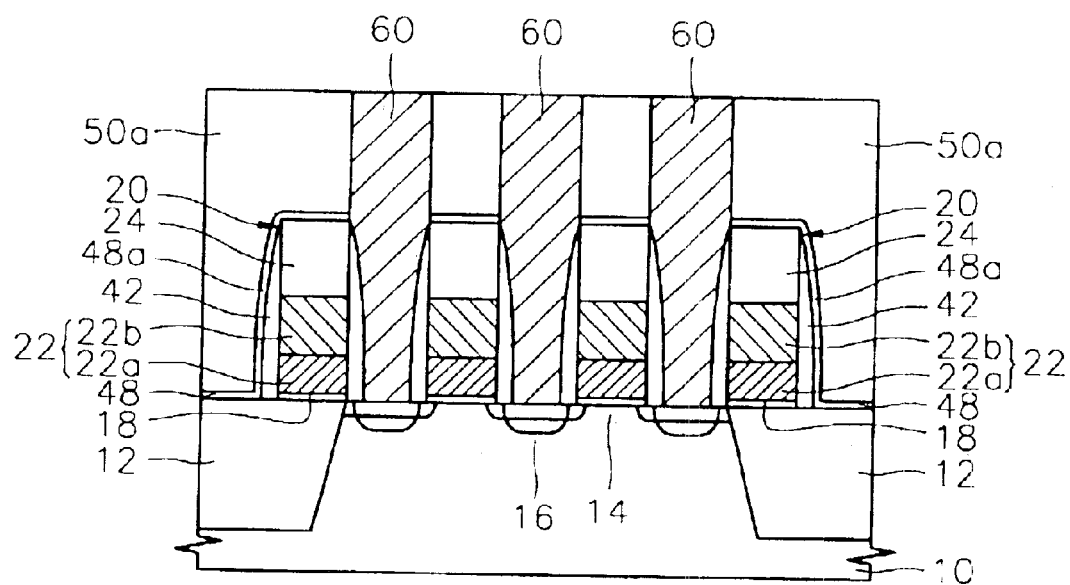

Referring to FIG. 1H, the holes $H_1$ are filled with a conductive material, for example, doped polysilicon, to form contact plugs 60 self-aligned with the gate structures 20.

A method for manufacturing a semiconductor device according to a second embodiment of the present invention will now be described with reference to FIGS. 2A through 2C.

Figure 2A:
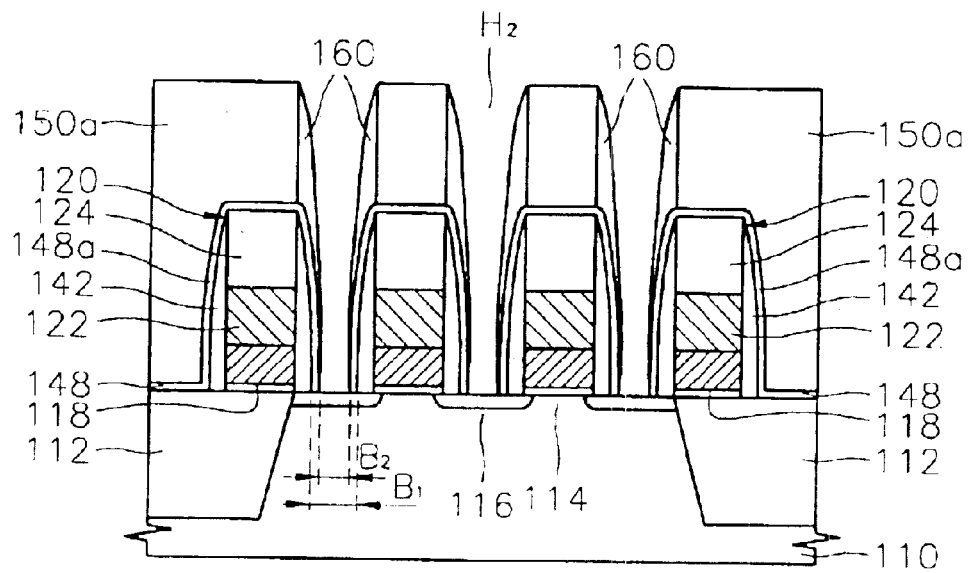
FIGS. 2A through 2C are sectional views illustrating a method for manufacturing a semiconductor device according to a second embodiment of the present invention.

Referring to FIG. 2A, isolation regions 112 are formed in a substrate 110 and gate structures 120 are formed on channel regions 114 in an active region, according to a method described with reference to FIGS. 1A through 1E. The gate structures 120 includes gate insulating layers 118, gate electrodes 122, and insulating layers 124 covering the gate electrodes 122, which are sequentially stacked. Impurity ions at a low dose are implanted into the substrate 110 using the gate structures 120 as a mask and first insulating spacers 142 formed of an insulating material such as silicon nitride are formed on the sidewalls of the gate structures 120. The first insulating spacers 142 are formed by depositing a silicon nitride layer on the gate structures 120 and etching back the silicon nitride layer. By forming the first insulating spacers 142, source/drain regions 116 of the semiconductor substrate 110 are exposed to a first width B1 in a direction orthogonal to the lengthwise direction of the gate electrodes 122. A liner 148 formed of silicon nitride is formed on the gate structures 120 and the first insulating spacers 142. By forming the liner 148, second insulating spacers 148a that cover the exposed surfaces of the first insulating spacers 142 are formed. A planarized interlayer insulating layer is formed on a resultant structure having the liner 148. An interlayer insulating layer pattern 150a for defining holes $H_2$ between the gate structures 120 is formed by etching the interlayer insulating layer by a self-aligned etching process using the difference between the etching selectivities of a silicon oxide layer and a silicon nitride layer. The portions of the liner 148, which cover the semiconductor substrate 110, remain on the bottom portions of the holes $H_2$ (not shown).

A silicon nitride layer is formed on the resultant structure having the interlayer insulating layer pattern 150a and etched back to form third insulating spacers 160 formed of the silicon nitride layer on the sidewalls of the interlayer insulating layer pattern 150a and the second insulating spacers 148a. As a result, the source/drain regions 116 of the semiconductor substrate 110 are exposed through spaces between adjacent third insulating spacers 160, which are exposed through the holes $H_2$, to a second width $B_2$, which is narrower than the first width $B_1$, in a direction orthogonal to the lengthwise direction of the gate electrodes 122. It is preferable that widths of the second insulating spacers 148a and the third insulating spacers 160 are controlled so that the second width B2 is narrower than the first width B1 by about 100 to 300 Å.

Figure 2B:
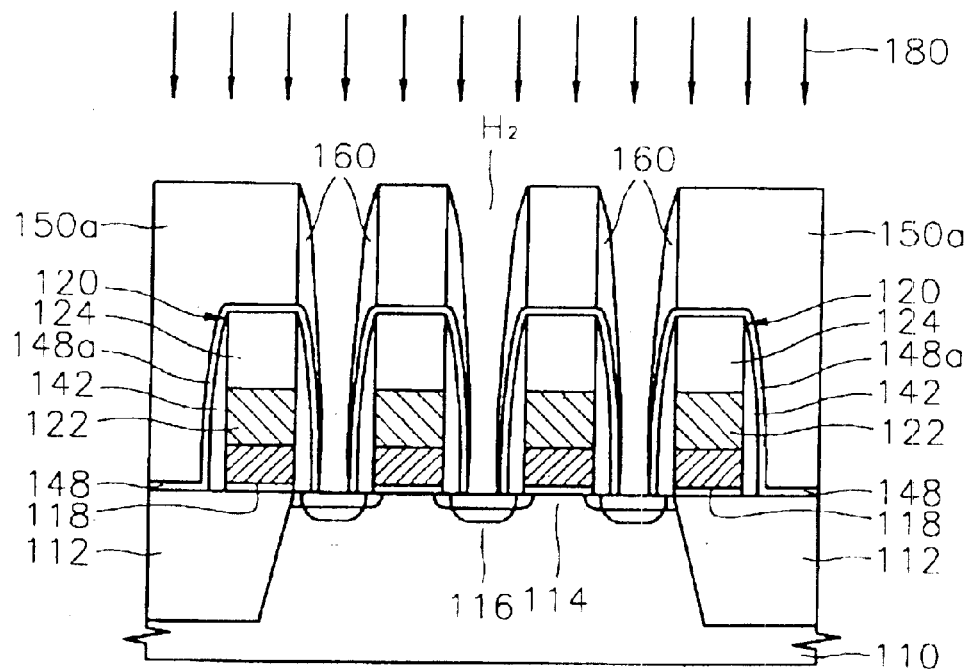

Referring to FIG. 2B, impurity ions 180 at a high dose are implanted into a resultant structure using the interlayer insulating layer pattern 150a and the third insulating spacers 160 as a mask. To this end, the ions, for example, phosphorous ions are implanted at a dose of about $4.0 \times 10^{13}$ ions/$cm^2$ at an energy level of about 30 KeV. As a result, because the width of the source/drain regions 116 of the semiconductor substrate 110, which are exposed to the ion implantation, is reduced to the second width $B_2$, the effective channel length to be formed in the channel regions 114 can be increased to twice the sum of the widths of the second and third insulating spacers 148a and 160.

Figure 2C:
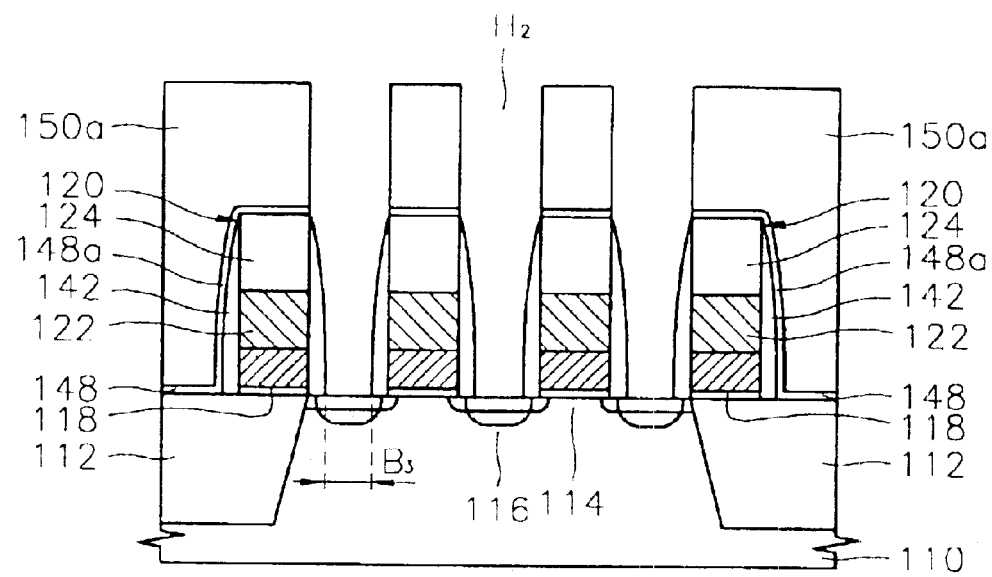

Referring to FIG. 2C, the third and second insulating spacers 160 and 148a, which are exposed through the holes $H_2$, are removed by an isotropic etching process described with reference to FIG. 1G. By removing the third and second insulating spacers 160 and 148a using isotropic etching process, the source/drain regions 116 of the semiconductor substrate 110 are exposed through the holes $H_2$ between adjacent first insulating spacers 142 to a third width $B_3$ wider than the second width $B_2$. Accordingly, since the source/drain regions 116 of the semiconductor substrate 110 are exposed to increased areas through the holes $H_2$, contact areas between the contact plugs to be formed in the holes $H_2$ in a subsequent process and the semiconductor substrate 110 can be increased. Therefore, an increased effective channel length is secured while an increase in contact resistance is prevented.

When removing the second and third insulating spacers 148a and 160, the third width $B_3$ of the source/drain regions 116 exposed through the holes $H_2$ can be approximately equal to the first width $B_1$ by leaving the first insulating spacers 142. To improve contact resistance characteristics, the portions of the first insulating spacers 142 can be additionally removed along with the second and third insulating spacers 148a and 160, increasing the third width $B_3$ of the source/drain regions 116. Thus, the third width $B_3$ can be greater than the first width $B_1$. Here, the size of the third width $B_3$ can be changed depending on the process conditions.

Thereafter, the holes $H_2$ are filled with a conductive material to form contact plugs (not shown) self-aligned with the gate structures 120 as described with reference to FIG. 1H.

A method for manufacturing a semiconductor device according to a third embodiment of the present invention will now be described with reference to FIGS. 3A through 3E.

Figure 3A:
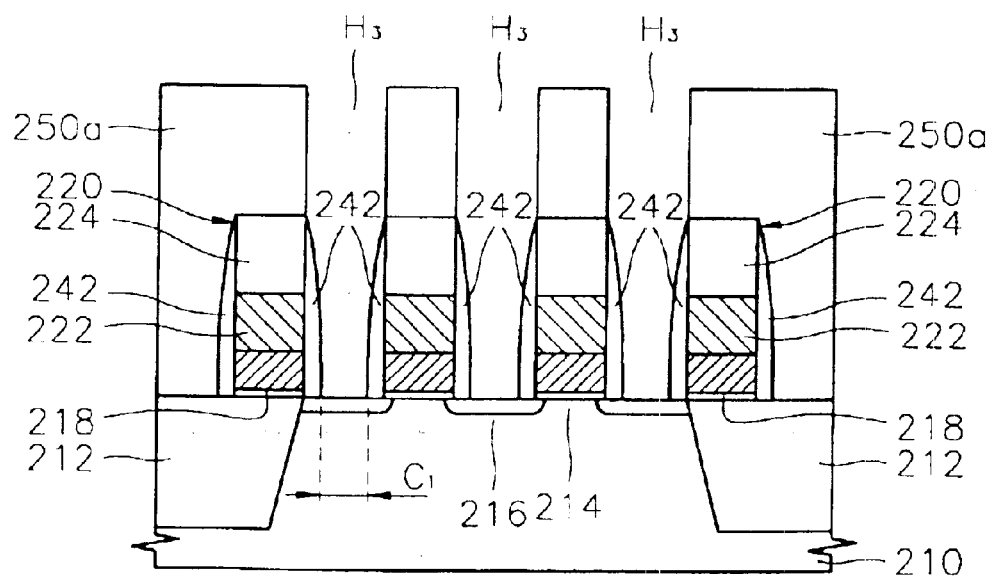
FIGS. 3A through 3E are sectional views illustrating a method for manufacturing a semiconductor device according to a third embodiment of the present invention.

Referring to FIG. 3A, isolation regions 212 are formed in a substrate 210 and gate structures 220 including gate insulating layers 218, gate electrodes 222, and insulating layers 224 covering the gate electrodes 222 are formed on channel regions 214 in an active region, according to a method described with reference to FIGS. 1A through 1B. Impurity ions at a low dose are implanted into the substrate 210 using the gate structures 220 as a mask, and first insulating spacers 242 formed of an insulating material such as silicon nitride are formed on the sidewalls of the gate structures 220. The first insulating spacers 242 are formed by depositing, for exanple, a silicon nitride layer on the gate structures 220 and etching back the silicon nitride layer. By forming the first insulating spacers 242, source/drain regions 216 of the semiconductor substrate 210 are exposed to a first width $C_1$ in a direction orthogonal to the lengthwise direction of the gate electrodes 222. Thereafter, a planarized interlayer insulating layer formed of, for example, an oxide layer is formed on the resultant structure having the first insulating spacers 242. Then, the interlayer insulating layer is etched to form an interlayer insulating layer pattern 250a using a self-aligned etching process. The interlayer insulating layer pattern 250a defines holes $H_3$ between the gate structures 220 to expose the semiconductor substrate 210 and the first insulating spacers 242.

Figure 3B:
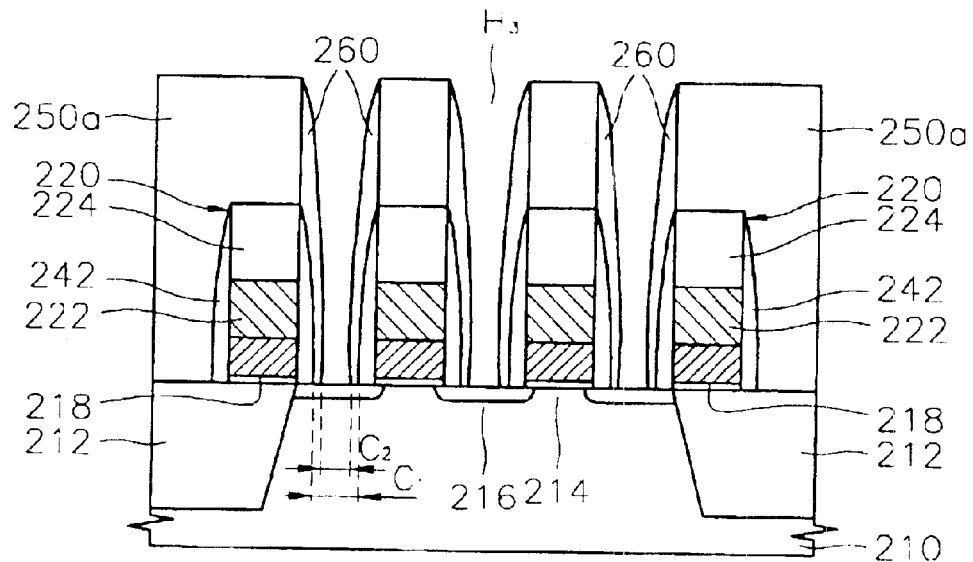

Referring to FIG. 3B, an insulating layer such as a silicon nitride layer is formed on the resultant structure having the interlayer insulating layer pattern 250a The insulating layer is then etched back to form second insulating spacers 260 formed of, for example, silicon nitride on the sidewalls of the interlayer insulating layer pattern 250a and the first insulating spacers 242. As a result, the source/drain regions 216 of the semiconductor substrate 210 are exposed between adjacent second insulating spacers 260, which are exposed through the holes $H_3$, to a second width $C_2$, narrower than the first width $C_1$, in a direction orthogonal to the lengthwise direction of the gate electrodes 222.

Figure 3C:
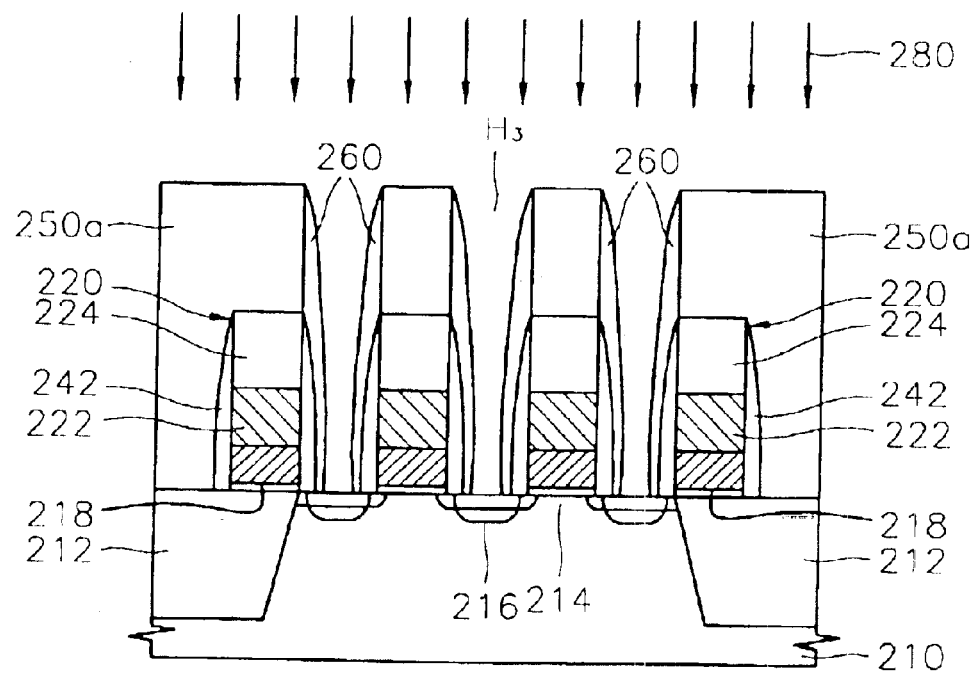

Referring to FIG. 3C, impurity ions 280 at a high dose are implanted into a resultant structure using the interlayer insulating layer pattern 250a and the second insulating spacers 260 as a mask. To this end, the ions, for example, phosphorous ions are implanted at a dose of $4.0 \times 10^{13}$ ions/$cm^2$ at an energy level of 30 KeV. As a result, since the width of the source/drain regions 216 of the semiconductor substrate 210, which are exposed to the ion implantation, is reduced to the second width $C_2$, an effective channel length to be formed in the channel regions 214 can be increased to twice the width of the second insulating spacers 260.

Figure 3D:
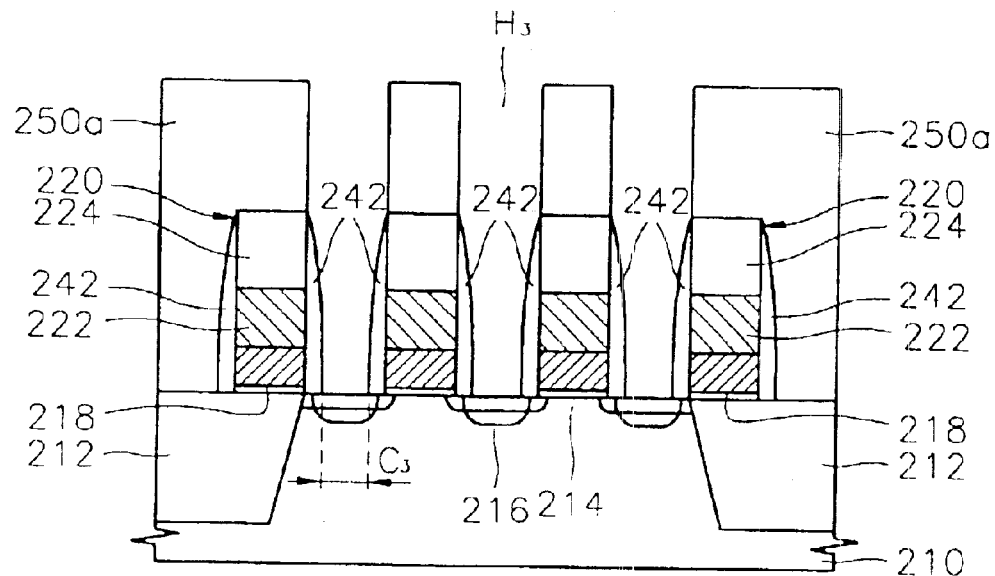

Referring to FIG. 3D, the second insulating spacers 260 exposed through the holes $H_3$ are removed by an isotropic etching process described with reference to FIG. 1G. By removing the second insulating spacers 260, the source/drain regions 216 of the semiconductor substrate 210 are exposed through the holes $H_3$ between adjacent first insulating spacers 242 to a third width $C_3$, wider than the second width $C_2$. Accordingly, since the source/drain regions 216 of the semiconductor substrate 210 are exposed to increased areas through the holes $H_3$, contact areas can be increased between the contact plugs to be formed in the holes $H_3$ in a subsequent process and the semiconductor substrate 210. Therefore, an increased effective channel length is secured while an increase in contact resistance is prevented.

By removing the second insulating spacers 260, the third width $C_3$ of the source/drain regions 216 exposed through the holes $H_3$ can be approximately equal to the first width $C_1$ by leaving the first insulating spacers 242. The portions of the first insulating spacers 242 can be removed along with the second insulating spacers 260 to increase the third width $C_3$ of the source/drain regions 216 larger than the first width $C_1$.

Figure 3E:
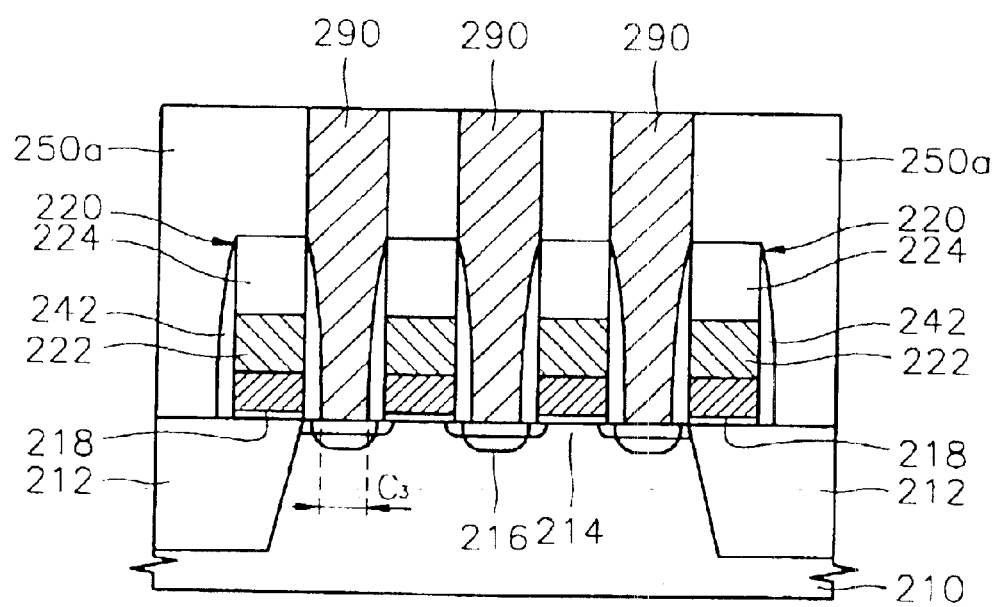

Referring to FIG. 3E, the holes $H_3$ are filled with a conductive material to form contact plugs 290 self-aligned with the gate structures 220 as described with reference to FIG. 1H.

A method for manufacturing a semiconductor device according to a fourth embodiment of the present invention will now be described with reference to FIGS. 4A through 4F.

Figure 4A:
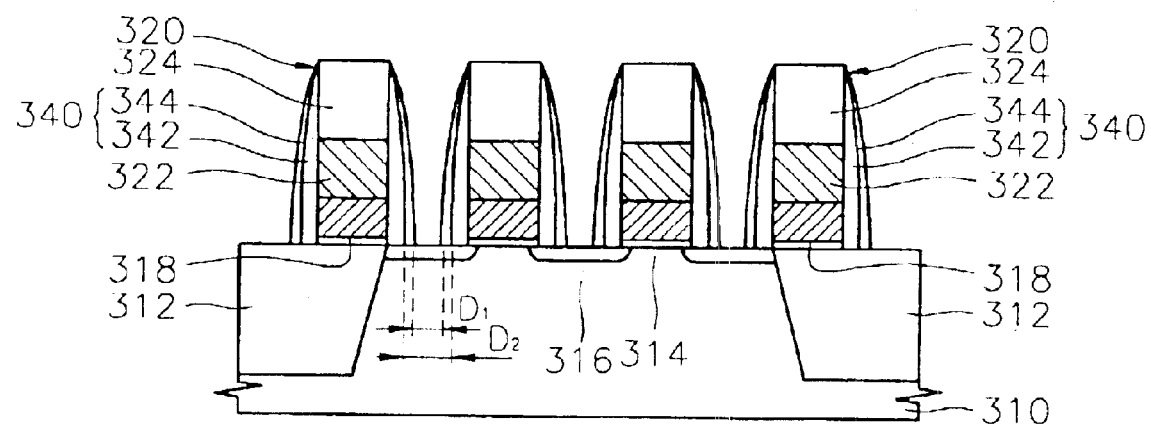
FIGS. 4A through 4F are sectional views illustrating a method for manufacturing a semiconductor device according to a fourth embodiment of the present invention.

Referring to FIG. 4A, isolation regions 312 are formed in a substrate 310, and gate structures 320 including gate insulating layers 318, gate electrodes 322, and insulating layers 324 covering the gate electrodes 322 are formed on channel regions 314 in an active region, according to a method described with reference to FIG. 1A. Impurity ions at a low dose are implanted into the substrate 310 using the gate structures 320 as a mask.

Thereafter, first insulating spacers 340 formed of, for example, silicon nitride layers 342 and silicon oxide layers 344 are formed on the sidewalls of the gate structures 320. Here, the first insulating spacers 340 are formed by depositing, for example, a silicon nitride layer on the gate structures 320 and etching back the silicon nitride layer. Next, a silicon oxide layer is preferably deposited on the gate structures 320 on which the silicon nitride layers 342 are formed and the silicon oxide is etched back to form the silicon oxide layers 344 on the silicon nitride layers 342. By forming the silicon oxide layers 344 of the first insulating spacers 340, source/drain regions 316 of the semiconductor substrate 310 are exposed to a first width $D_1$ in a direction orthogonal to the lengthwise direction of the gate electrodes 322. The first width $D_1$ is narrower than a second width $D_2$, which is defined by the silicon nitride layers 342 of the first insulating spacers 340 between the gate electrodes 322, and much narrower than the width of contact plugs to be formed between the gate electrodes 322.

Figure 4B:
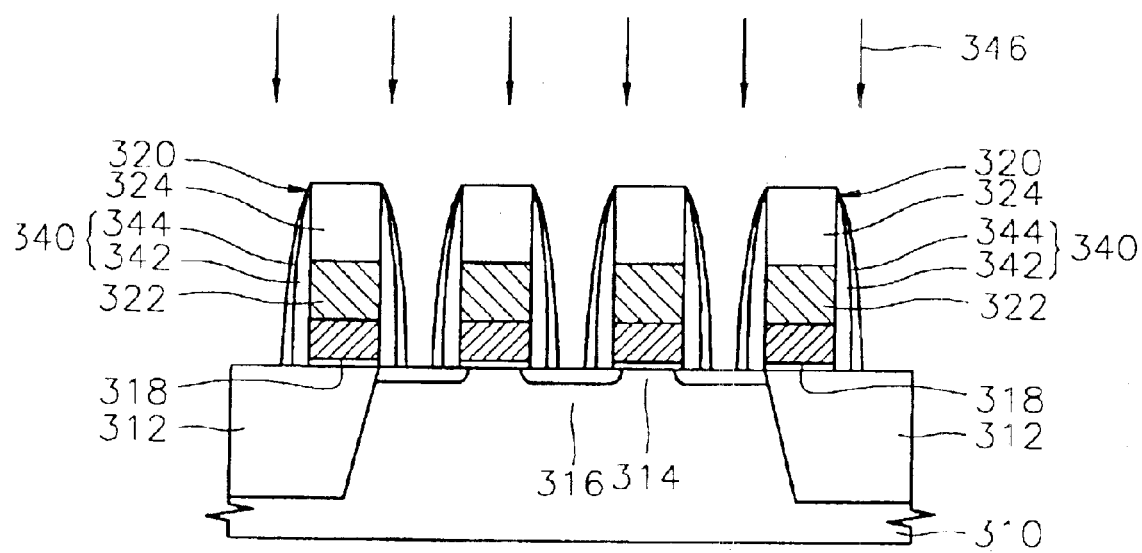

Referring to FIG. 4B, impurity ions 346 at a low dose are additionally implanted into the semiconductor substrate 310 using the gate structures 320 and the first insulating spacers 340 as a mask. The additional implantation of the impurity ions 346 at a low dose can be performed under the same conditions as the impurity ion implantation process described with reference to FIG. 4A. As described above, the impurity ions 346 at a low dose are implanted into regions having the first width $D_1$ so that an effective channel length to be formed in the channel regions 314 can be increased.

Figure 4C:
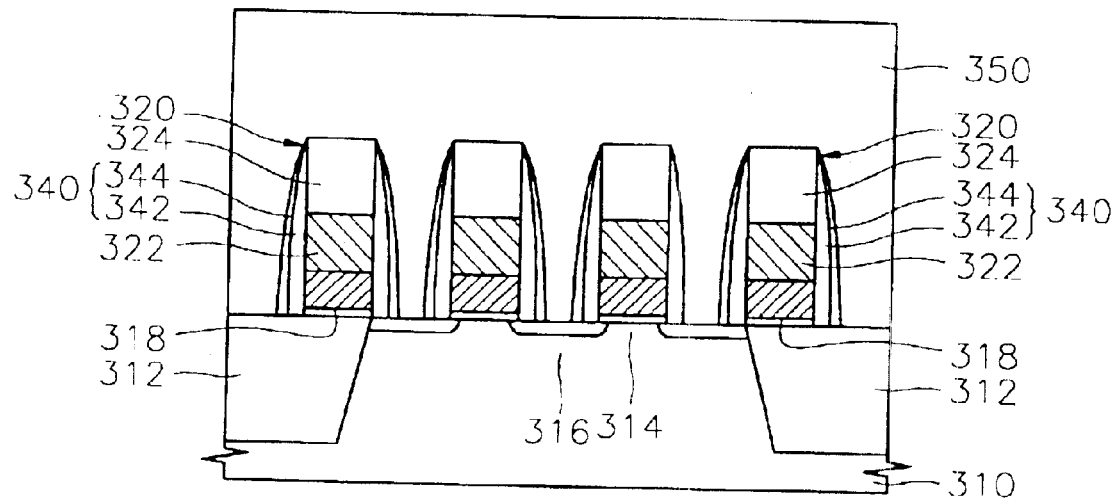

Referring to FIG. 4C, a planarized interlayer insulating layer 350 formed of, for example, an oxide layer is implanted by the method described with reference to FIG. 1D.

Figure 4D:
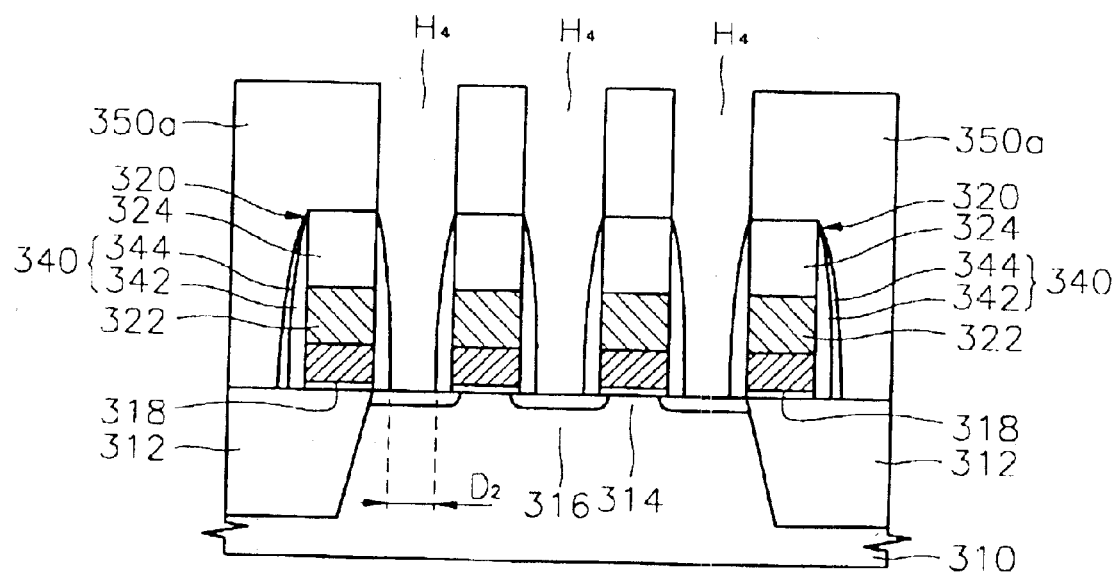

Referring to FIG. 4D, the interlayer insulating layer 350 is etched to form an interlayer insulating layer pattern 350a, using a self-aligned etching process. The self-aligned etching process uses the difference between the etching selectivities of insulating layers such as a silicon oxide layer and a silicon nitride layer while using a photoresist layer pattern (not shown). Because the etching process is performed using the difference between the etching selectivities of the silicon oxide layer and the silicon nitride layer, the silicon oxide layers 344 of the first insulating spacers 340 are removed while forming the interlayer insulating layer pattern 350a. Consequently, the semiconductor substrate 310 and the silicon nitride layers 342 of the first insulating spacers 340 are exposed through holes $H_4$ formed in the interlayer insulating layer pattern 350a between the gate structures 320. In addition, the source/drain regions 316 of the semiconductor substrate 310 are exposed between adjacent silicon nitride layers 342, through the holes $H_4$, to a second width $D_2$ wider than the first width $D_1$, in a direction orthogonal to the lengthwise direction of the gate electrodes 322.

Figure 4E:
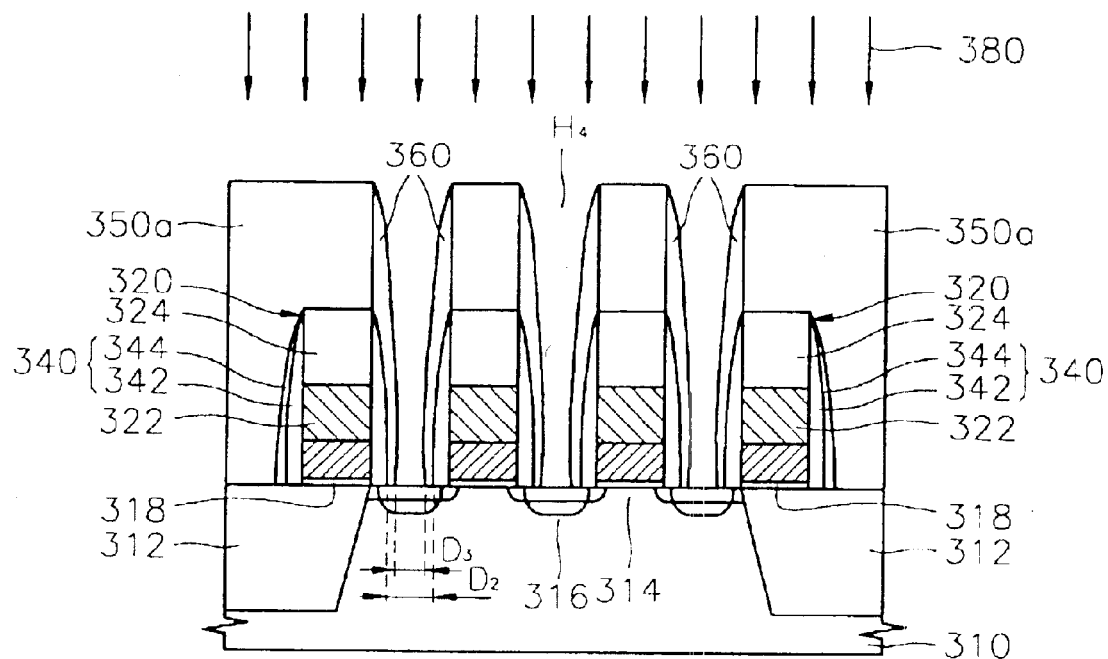

Referring to FIG. 4E, an insulating layer such as a silicon nitride layer is formed on the resultant structure having the interlayer insulating layer pattern 350a and etched back to form second insulating spacers 360 on the sidewalls of the interlayer insulating layer pattern 350a and the silicon nitride layers 342 of the first insulating spacers 340. As a result, the source/drain regions 316 of the semiconductor substrate 310 are exposed through the holes $H_4$, between adjacent second insulating spacers 360, to a third width $D_3$ narrower than the second width $D_2$, in a direction orthogonal to the lengthwise direction of the gate electrodes 322.

Thereafter, impurity ions 380 at a high dose are implanted into the resultant structure using the interlayer insulating layer pattern 350a and the second insulating spacers 360 as a mask. To this end, the ions, for example, phosphorous ions are implanted to a dose of about $4.0 \times 10^{13}$ ions/$cm^2$ at an energy level of about 30 KeV. As a result, since the width of the source/drain regions 316 of the semiconductor substrate 310, which are exposed to the ion implantation, is reduced to the third width $D_3$, the effective channel length to be formed in the channel regions 314 can be increased to twice the width of the second insulating spacers 360.

Figure 4F:
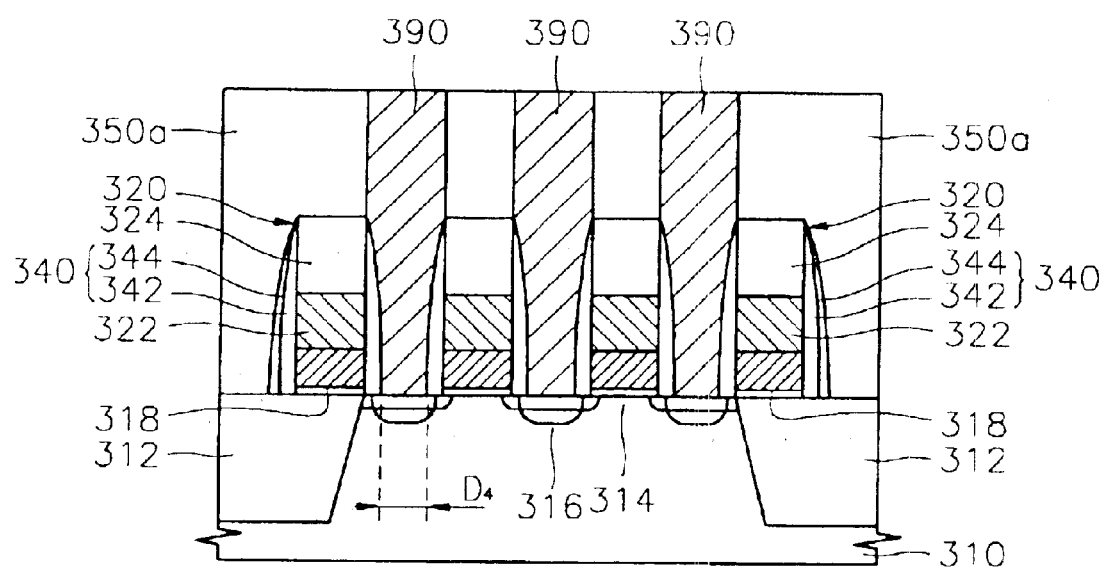

Referring to FIG. 4F, the second insulating spacers 360 exposed through the holes $H_4$ are removed by an isotropic etching process described with reference to FIG. 1G. By removing the second insulating spacers 360 using the isotropic etching process, the source/drain regions 316 of the semiconductor substrate 310 are exposed through the holes $H_4$, between adjacent silicon nitride layers 342, to a fourth width $D_4$ wider than the third width $D_3$. The size of the fourth width $D_4$ can be controlled to be substantially the same as or larger than the size of the second width $D_2$. Accordingly, since the source/drain regions 316 of the semiconductor substrate 310 are exposed to increased areas through the holes $H_4$, contact areas between contact plugs 390 and the semiconductor substrate 310 increase. Therefore, an increased effective channel length is secured while an increase in contact resistance is prevented.

A method for manufacturing a semiconductor device according to a fifth embodiment of the present invention will now be described with reference to FIGS. 5A through 5F.

Figure 5A:
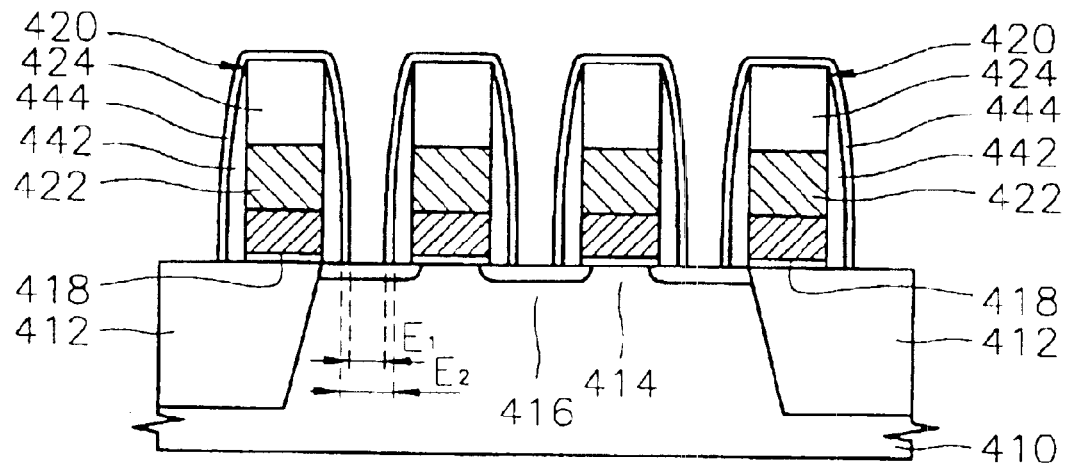
FIGS. 5A through 5F are sectional views illustrating a method for manufacturing a semiconductor device according to a fifth embodiment of the present invention.

Referring to FIG. 5A, isolation regions 412 are formed in a substrate 410, and gate structures 420 including gate insulating layers 418, gate electrodes 422, and insulating layers 424 covering the gate electrodes 422 are formed on channel regions 414 in an active region, according to a method described with reference to FIG. 1A. Impurity ions at a low dose are implanted into the substrate 410, using the gate structures 420 as a mask.

Thereafter, first insulating spacers 442 formed of an insulating material such as silicon nitride are formed on the sidewalls of the gate structures 420. The first insulating spacers 442 can be formed by depositing, for example, a silicon nitride layer on the gate structures 420 and etching back the silicon nitride layer. A liner 444 formed of, for example, silicon oxide is formed on the gate structures 420 and on the first insulating spacers 442. Here, the liner 444 is formed to a thickness of about 20 to 200 Å and preferably to a thickness of about 100 Å. By forming the liner 444, source/drain regions 416 of the semiconductor substrate 410 are exposed to a first width $E_1$ in a direction orthogonal to the lengthwise direction of the gate electrodes 422. The first width $E_1$ is narrower than a second width $E_2$, which is defined by the first insulating spacers 442 between the gate electrodes 422, and much narrower than the width of the contact plugs to be formed between the gate electrodes 422.

Figure 5B:
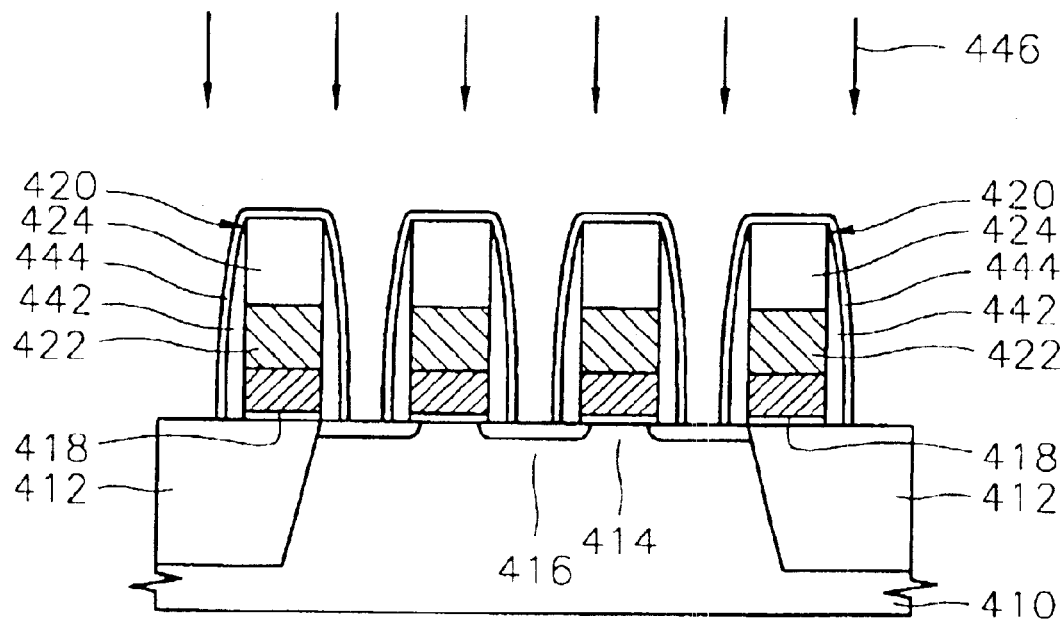

Referring to FIG. 5B, impurity ions 446 at a low dose are additionally implanted into the semiconductor substrate 410 using the liner 444 formed on the gate structures 420 and the first insulating spacers 442 as a mask. The additional implantation of the impurity ions 446 at a low dose can be performed under the same conditions as the impurity ion implantation process described with reference to FIG. 5A. As described above, the impurity ions 446 at a low dose are implanted into regions having the first width $E_1$ so that an effective channel length to be formed in the channel regions 414 can be increased.

Figure 5C:
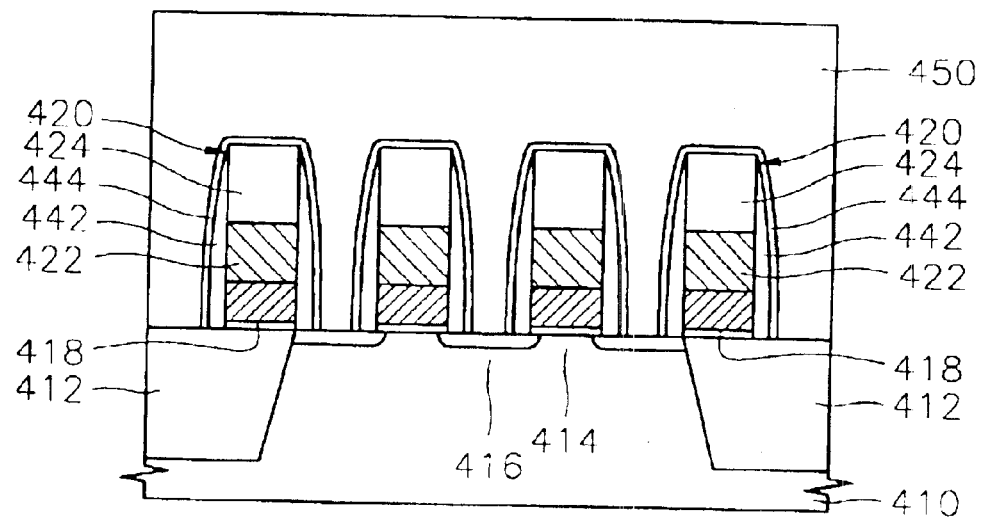

Referring to FIG. 5C, a planarized interlayer insulating layer 450 formed of, for example, an oxide layer is formed on a resultant structure into which the impurity ions 446 at a low dose is additionally implanted by the method described with reference to FIG. 1D.

Figure 5D:
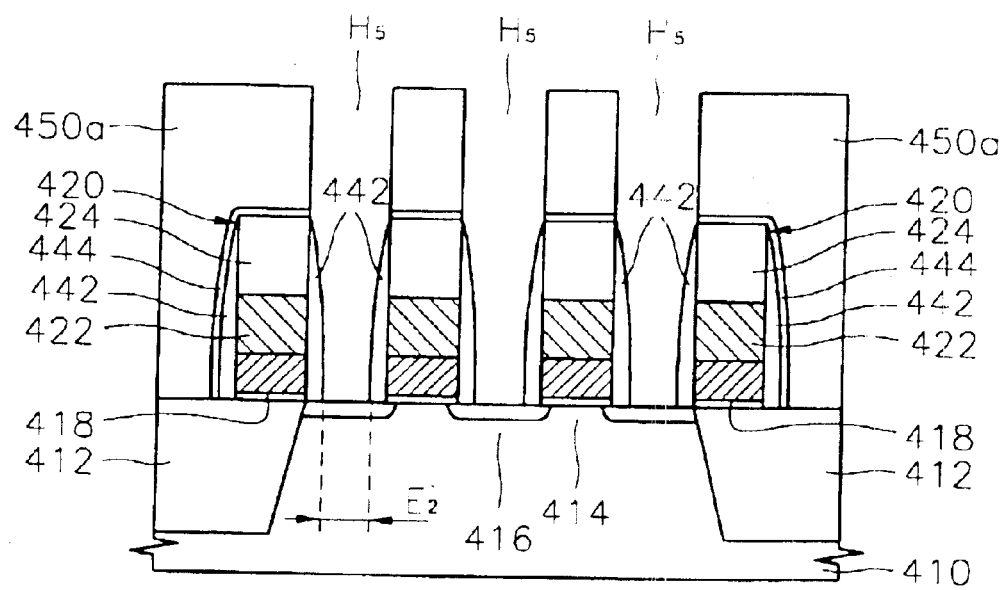

Referring to FIG. 5D, the interlayer insulating layer 450 is etched by a self-aligned etching process that uses difference between the etching selectivities of a silicon oxide layer and a silicon nitride layer while using a photoresist layer pattern (not shown) to form an interlayer insulating layer pattern 450a. Because the etching process is performed using difference between the etching selectivities of the silicon oxide layer and the silicon nitride layer, the portions of the liner 444 formed on the first insulating spacers 442 are removed while forming the interlayer insulating layer pattern 450a. Consequently, the semiconductor substrate 410 and the first insulating spacers 442 are exposed through holes $H_5$ formed in the interlayer insulating layer pattern 450a between the gate structures 420. In addition, the source/drain regions 416 of the semiconductor substrate 410 are exposed through the holes $H_5$, between adjacent first insulating spacers 442, to a second width $E_2$ wider than the first width $E_1$, in a direction orthogonal to the lengthwise direction of the gate electrodes 422.

Figure 5E:
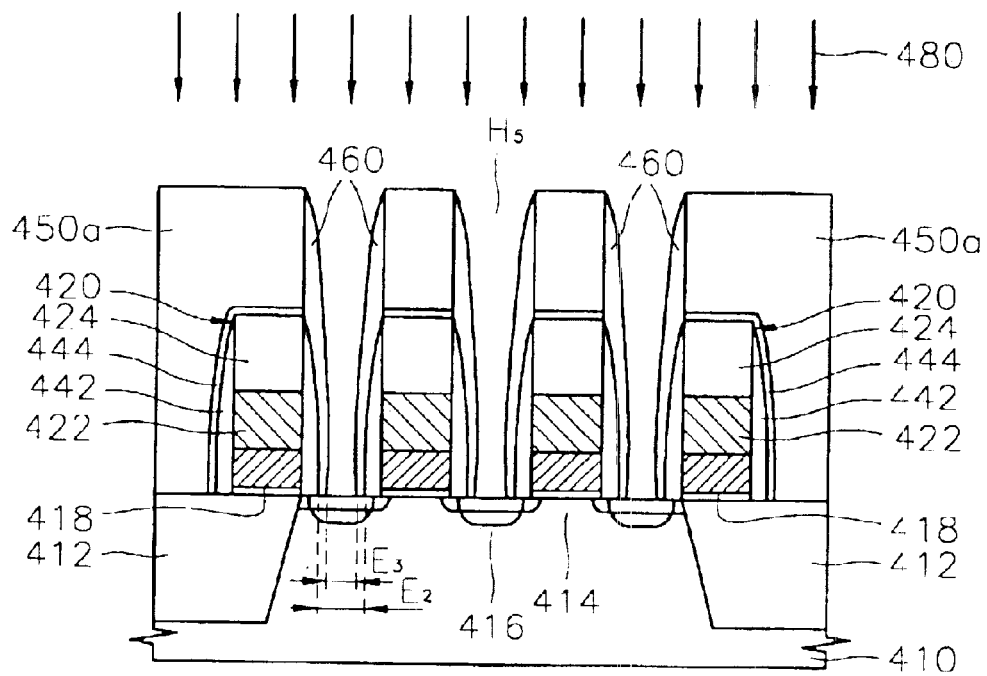

Referring to FIG. 5E, an insulating layer such as a silicon nitride layer is formed on the resultant structure having the interlayer insulating layer pattern 450a and etched back to form second insulating spacers 460 formed of the silicon nitride layer on the sidewalls of the interlayer insulating layer pattern 450a and the first insulating spacers 442. As a result, the source/drain regions 416 of the semiconductor substrate 410 are exposed through spaces between adjacent second insulating spacers 460, which are exposed through the holes $H_5$, to a third width $E_3$, which is narrower than the second width $E_2$, in a direction orthogonal to the lengthwise direction of the gate electrodes 422.

Thereafter, impurity ions 480 at a high dose are implanted into the resultant structure using the interlayer insulating layer pattern 450a and the second insulating spacers 460 as a mask. To this end, the ions, for example, phosphorous ions are implanted at a dose of about $4.0 \times 10^{13}$ ions/cm$^2$ at an energy level of about 30 KeV. As a result, since the width of the source/drain regions 416 of the semiconductor substrate 410, which are exposed to the ions, is reduced to the third width $E_3$, the effective channel length to be formed in the channel regions 414 can be increased to twice the width of the second insulating spacers 460.

Figure 5F:
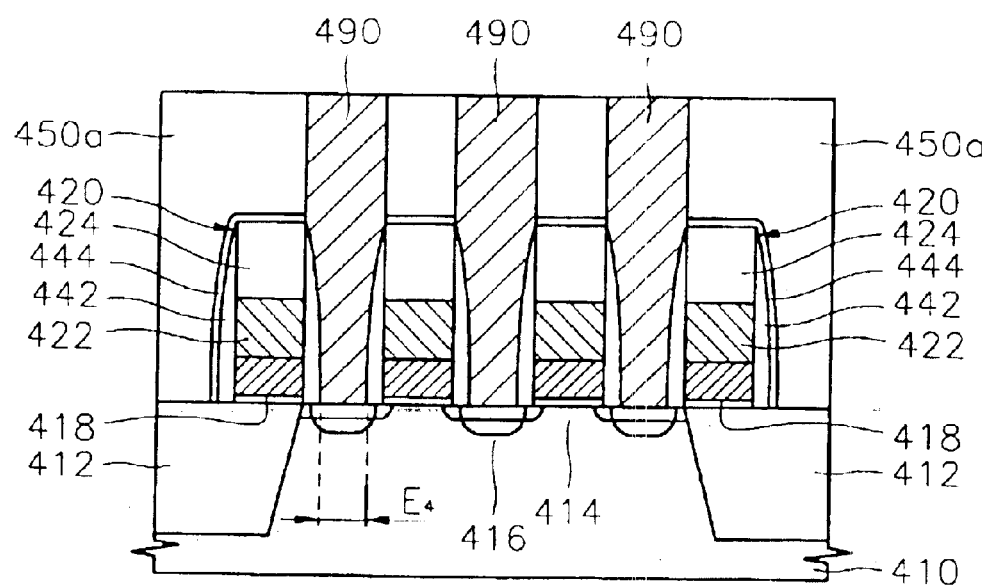

Referring to FIG. 5F, the second insulating spacers 460 exposed through the holes $H_5$ are removed by an isotropic etching process described with reference to FIG. 1G. By removing the second insulating spacers 460 by the isotropic etching process, the source/drain regions 416 of the semiconductor substrate 410 are exposed through the holes $H_5$ between adjacent first insulating spacers 442 to a fourth width $E_4$ wider than the third width $E_3$. If desired, the fourth width $E_4$ can be controlled to be about the same as or larger than the second width $E_2$. Accordingly, because more regions of the source/drain regions 416 of the semiconductor substrate 410 are exposed through the holes $H_5$, contact areas between contact plugs 490 and the semiconductor substrate 410 increase. Therefore, an increased effective channel length is secured while an increase in contact resistance is prevented.

According to embodiments of the present invention described above, insulating spacers are formed on the sidewalls of gate structures and on interlayer insulating layer patterns to secure sufficient contact areas between source/drain regions and contact plugs so as to improve contact resistance characteristics while increasing the effective channel length of transistors. In other words, spacers for reducing the exposed areas of the source/drain regions are formed before performing a high-dose implantation process for forming source/drain regions. Thus, the exposed areas of a semiconductor substrate can be reduced and an effective channel length can be increased. In addition, after the high-dose implantation process for forming source/drain regions is completed, the spacers are removed by an isotropic etching process. Consequently, contact areas between the source/drain regions and the contact plugs formed thereon are increased, improving contact resistance characteristics.

According to an aspect of the present invention, channel length and contact areas can be controlled, using insulating spacers in manufacturing a highly integrated semiconductor device, for example, having a design rule of less than 0.2 μm and contact plugs self-aligned with gate electrodes. Therefore, operational characteristics of, for example, DRAM cells can be improved by securing reliability of cell transistors, while preventing the contact resistance of the semiconductor device from increasing.

The invention has been described with reference to various exemplary embodiments thereof. The scope of the present invention must not be interpreted, however, as being restricted to these exemplary embodiments. Rather, it will be apparent to those of ordinary skill in the art that various modifications may be made to the described embodiments without departing from the spirit and scope of the invention.

What is claimed is:

1. A method for manufacturing a semiconductor device, the method comprising:

forming a plurality of gate structures including gate electrodes and insulating layers covering the gate electrodes on a semiconductor substrate;

implanting impurity ions at a low dose to initially form a source/drain region into the semiconductor substrate, using the gate structures as a mask;

forming first insulating spacers on sidewalls of the gate structures;

forming a liner on the gate structures and the first insulating spacers to form second insulating spacers on the first insulating spacers;

forming a planarized interlayer insulating layer pattern on the gate structures, the planarized interlayer insulating having holes therein between adjacent second insulating spacers to expose a region of the semiconductor substrate;

implanting impurity ions at a high dose to completely form the source/drain region into the semiconductor substrate, using the interlayer insulating layer pattern and the second insulating spacers as a mask; and removing the second insulating spacers.

2. The method for manufacturing a semiconductor device of claim 1, wherein removing the second insulating spacers comprises performing a wet etching process using ozone water.

3. The method for manufacturing a semiconductor device of claim 2, wherein removing the second insulating spacers comprises:

performing a first wet etching process using an etchant having the ozone water and a hydrogen fluoride (HF) solution; and performing a second wet etching process using the ozone water.

4. The method for manufacturing a semiconductor device of claim 3, wherein the ozone water and the HF solution is mixed at a volume ratio of about 1000:1 to about 1500:1 to form the etchant.

5. The method for manufacturing a semiconductor device of claim 1, wherein removing the second insulating spacers comprises performing a down-stream plasma etching process, using a gas mixture including oxygen ($O_2$) and carbon fluoride ($CF_4$).

6. The method of manufacturing a semiconductor device of claim 5, wherein $O_2$ and $CF_4$ is mixed at a flow ratio of about 10:1 to about 100:1 to form the gas mixture.

7. The method of manufacturing a semiconductor device of claim 1, wherein the interlayer insulating layer pattern comprises a borophosphosilicate glass (BPSG) or high density plasma (HDP) oxide layer.

8. The method of manufacturing a semiconductor device of claim 1, further comprising, after forming a planarized interlayer insulating layer pattern:

forming third insulating spacers on sidewalls of the interlayer insulating pattern and on sidewalls of the second insulating spacers, wherein implanting impurity ions at a high dose comprises, using the interlayer insulating layer pattern and the third insulating spacers as a mask.

9. The method of manufacturing a semiconductor device of claim 8, further comprising concurrently removing the second insulating spacers and the third insulating spacers.

10. The method for manufacturing a semiconductor device of claim 9, wherein concurrently removing the second insulating spacers and the third insulating spacers comprises performing a wet etching process using ozone water.

11. The method for manufacturing a semiconductor device of claim 10, wherein performing a wet etching process further comprises:

performing a first wet etching process using an etchant having the ozone water and a HF solution; and performing a second wet etching process using the ozone water.

12. The method for manufacturing a semiconductor device of claim 11, wherein the ozone water and the HF solution is mixed at a volume ratio of about 1000:1 to about 1500:1.

13. The method for manufacturing a semiconductor device of claim 9, wherein concurrently removing the second insulating spacers and the third insulating spacers comprises performing a down-stream plasma etching process, using a gas mixture including $O_2$ and $CF_4$.

14. The method for manufacturing a semiconductor device of claim 13, wherein $O_2$ and $CF_4$ is mixed at a flow ratio of about 10:1 to about 100:1 to form the gas mixture.

15. The method for manufacturing a semiconductor device of claim 8, wherein the interlayer insulating layer pattern comprises a BPSG or HDP oxide layer.

16. A method for manufacturing a semiconductor device, the method comprising:

forming a plurality of gate structures including gate electrodes and insulating layers covering the gate electrodes on a semiconductor substrate;

implanting impurity ions at a low dose to initially form a source/drain region into the semiconductor substrate, using the gate structures as a mask;

forming first insulating spacers on the sidewalls of the gate structures;

forming a planarized interlayer insulating layer pattern on the gate structures, the planarized interlayer insulating layer pattern having holes therein to expose the low dose impurity ion implanted semiconductor device;

forming second insulating spacers on sidewalls of the interlayer insulating layer pattern and on sidewalls of the first insulating spacers;

implanting impurity ions at a high dose to completely form the source/drain region into the semiconductor substrate, using the interlayer insulating layer pattern and the second insulating spacers as a mask; and removing the second insulating spacers.

17. The method for manufacturing a semiconductor device of claim 16, wherein removing the second insulating spacers comprises performing a wet etching process using ozone water.

18. The method, for manufacturing a semiconductor device of claim 17, wherein removing the second insulating spacers further comprises:

performing a first wet etching process using an etchant comprising a mixed solution including the ozone water and a HF solution; and performing a second wet etching process using the ozone water.

19. The method for manufacturing a semiconductor device of claim 18, wherein the ozone water and the HF solution is mixed at a volume ratio of about 1000:1 to about 1500:1 to form the mixed solution.

20. The method for manufacturing a semiconductor device of claim 16, wherein removing the second insulating spacers comprises performing a down-stream plasma etching method, using a gas mixture including $O_2$ and $CF_4$.

21. The method for manufacturing a semiconductor device of claim 20, wherein $O_2$ and $CF_4$ is mixed at a flow ratio of about 10:1 to about 100:1 to form the gas mixture.

22. The method for manufacturing a semiconductor device of claim 16, wherein the interlayer insulating layer pattern comprises a BPSG or HDP oxide layer.

23. The method for manufacturing a semiconductor device of claim 16, wherein the first insulating spacers comprise silicon nitride.

24. The method for manufacturing a semiconductor device of claim 16, wherein the first insulating spacers comprise silicon nitride layers contacting the gate structures and silicon oxide layers formed on the silicon nitride layers.

25. The method for manufacturing a semiconductor device of claim 24, further comprising additionally implanting impurity ions at a low dose into the semiconductor substrate, using the gate structures and the first insulating spacers as a mask, after the first insulating spacers are formed.

26. The method for manufacturing a semiconductor device of claim 16, further comprising:

forming a liner on the gate structures and the first insulating spacers, after the first insulating spacers are formed; and additionally implanting impurity ions at a low dose into the semiconductor substrate using the liner as a mask.

27. The method for manufacturing a semiconductor device of claim 26, wherein forming the interlayer insulating layer pattern comprises:

forming a planarized interlayer insulating layer on the semiconductor substrate, into which the impurity ions of low are additionally implanted, and on the liner;

patterning the interlayer insulating layer to form the holes therein; and removing portions of the liner to expose the first insulating spacers while patterning the interlayer insulating layer.

28. A method for manufacturing a semiconductor device, the method comprising:

providing a semiconductor substrate having a first region to form channels therein and a second region to form a source/drain region;

forming gate electrodes on the first region;

implanting impurity ions at a low dose into the second region, using the gate electrodes as a mask;

forming first insulating spacers on sidewalls of the gate electrodes to expose the second region to a first width in a first direction orthogonal to a lengthwise direction of the gate electrodes;

forming a planarized interlayer insulating layer pattern on the gate electrodes, the planarized interlayer insulating layer having holes therein to expose the first insulating spacers;

forming second insulating spacers on sidewalls of the interlayer insulating layer pattern and on sidewalls of the first insulating spacers to expose the second region to a second width, which is narrower than the first width;

implanting impurity ions at a high dose into the second region, using the interlayer insulating layer pattern and the second insulating spacers as a mask; and removing the second insulating spacers to expose the second region to the first width.

29. The method for manufacturing a semiconductor device of claim 28, further comprising removing portions of the first insulating spacers to expose the second region to a third width, which is wider than the first width.

30. The method for manufacturing a semiconductor device of claim 28, wherein removing the second insulating spacers comprises performing a wet etching process, using a mixed solution having ozone water and a HF solution.

31. The method for manufacturing a semiconductor device of claim 28, wherein removing the second insulating spacers comprises performing a down-stream plasma etching process using a gas mixture having $O_2$ and $CF_4$.

32. The method for manufacturing a semiconductor device of claim 28, further comprising forming a nitride liner on the first insulating spacers to expose the second region to a fourth width, which is narrower than the first width, in the first direction, wherein the second insulating spacers are formed on the nitride liner.

33. The method for manufacturing a semiconductor device of claim 28, further comprising:

forming an oxide liner on the first insulating spacers to expose the second region to a fourth width, which is narrower than the first width; and additionally implanting impurity ions at a low dose into the second region, using the oxide liner as a mask.

34. The method for manufacturing a semiconductor device of claim 33, wherein forming a planarized interlayer insulating layer pattern comprises:

forming a planarized interlayer insulating layer on the oxide liner and on the second region;

patterning the interlayer insulating layer to form holes therein to expose the second region; and removing the oxide liner to expose the first insulating spacers while patterning the interlayer insulating layer.

35. The method for manufacturing a semiconductor device of claim 28, further comprising forming a conductive plug within the holes.

* * * * *